United States Patent
Kyaw et al.

(10) Patent No.: US 12,176,395 B1
(45) Date of Patent: Dec. 24, 2024

(54) STRUCTURES FOR A LATERALLY-DIFFUSED METAL-OXIDE-SEMICONDUCTOR TRANSISTOR

(71) Applicant: GlobalFoundries Singapore Pte. Ltd., Singapore (SG)

(72) Inventors: Lwin Min Kyaw, Singapore (SG); Dong Hyun Shin, Singapore (SG); Upinder Singh, Singapore (SG); Jeoung Mo Koo, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/632,506

(22) Filed: Apr. 11, 2024

(51) Int. Cl.
*H01L 29/08* (2006.01)
*H01L 29/66* (2006.01)
*H01L 29/78* (2006.01)
*H01L 21/762* (2006.01)

(52) U.S. Cl.
CPC ...... *H01L 29/0869* (2013.01); *H01L 29/0865* (2013.01); *H01L 29/0882* (2013.01); *H01L 29/0886* (2013.01); *H01L 29/66681* (2013.01); *H01L 29/7816* (2013.01); *H01L 29/7823* (2013.01); *H01L 21/76224* (2013.01)

(58) Field of Classification Search
CPC ........... H01L 29/66681; H01L 29/7816; H01L 29/0865; H01L 29/0869; H01L 29/0882; H01L 29/0886
See application file for complete search history.

(56) References Cited

U.S. PATENT DOCUMENTS

| 8,716,795 B2 | 5/2014 | You |
| 10,510,831 B2 | 12/2019 | Mun et al. |
| 11,282,953 B2 | 3/2022 | Li et al. |

(Continued)

OTHER PUBLICATIONS

M. Elwin et al., "Optimisation of 100V high side LDMOS using multiple simulation techniques," 2009 21st International Symposium on Power Semiconductor Devices & IC's, Barcelona, 2009, pp. 104-107, doi: 10.1109/ISPSD.2009.5158012.

(Continued)

*Primary Examiner* — Joseph C. Nicely
(74) *Attorney, Agent, or Firm* — Thompson Hine LLP; Francois Pagette

(57) ABSTRACT

Structures for a laterally-diffused metal-oxide-semiconductor device and methods of forming a structure for a laterally-diffused metal-oxide-semiconductor device. The structure comprises a drain and a source in a semiconductor substrate. The source includes a source region having a first terminating end, a second terminating end, and a length between the first terminating end and the second terminating end. The structure further comprises a shallow trench isolation region in the semiconductor substrate. The shallow trench isolation region surrounds the drain. The structure further comprises a gate that surrounds the shallow trench isolation region and the drain. The gate has a side section between the drain and the source region, the side section of the gate has a width, and the gate has a length in a direction transverse to the width. The length of the source region is substantially equal to the length of the gate.

20 Claims, 4 Drawing Sheets

(56) References Cited

U.S. PATENT DOCUMENTS

| | | | | |
|---|---|---|---|---|
| 2016/0079378 A1* | 3/2016 | Scuderi | ............... | H03K 17/162 257/335 |
| 2016/0141421 A1* | 5/2016 | Campi, Jr. | ............... | H01G 4/14 257/337 |
| 2016/0225899 A1* | 8/2016 | Yang | ................. | H01L 29/41766 |
| 2019/0319130 A1* | 10/2019 | Campi, Jr. | ............... | H01G 4/20 |
| 2019/0326434 A1* | 10/2019 | Sekikawa | ........... | H01L 29/0865 |

OTHER PUBLICATIONS

Roh, Tae Moon et al., (2001). "Improvement of breakdown characteristics of LDMOSFETs with uneven racetrack sources for PDP driver applications." 165-168. 10.1109/ISPSD.2001.934581.

Muneeswaran, Dhamodaran. (2018). "On-Chip Spiral Inductors and On-Chip Spiral Transistors for Accurate Numerical Modeling." Journal of Magnetics. 23. 10.4283/JMAG.2018.23.1.050.

Bucher, Matt & Bazigos, Antonios & Yoshitomi, Sadayuki & Itoh, Nobuyuki. (2008). "A scalable advanced RF IC design-oriented MOSFET model." International Journal of RF and Microwave Computer-Aided Engineering. 18. 314-325. 10.1002/mmce.20288.

\* cited by examiner

STRUCTURES FOR A LATERALLY-DIFFUSED METAL-OXIDE-SEMICONDUCTOR TRANSISTOR

BACKGROUND

The disclosure relates generally to semiconductor devices and integrated circuit fabrication and, more specifically, to structures for a laterally-diffused metal-oxide-semiconductor device and methods of forming a structure for a laterally-diffused metal-oxide-semiconductor device.

High-voltage integrated circuits used, for example, in power amplifiers typically require specialized device technology capable of withstanding high voltages, such as voltages within a range of seven volts to fifty volts. Laterally-diffused metal-oxide-semiconductor transistors, also known as extended-drain metal-oxide-semiconductor transistors, are devices that are designed to handle such high voltages by incorporating additional transistor features, such as a drift well providing an extended drain, that enhance the voltage-handling capability.

Improved structures for a laterally-diffused metal-oxide-semiconductor device and methods of forming a structure for a laterally-diffused metal-oxide-semiconductor device are needed.

SUMMARY

In an embodiment, a structure for a laterally-diffused metal-oxide-semiconductor transistor is provided. The structure comprises a semiconductor substrate, a drain in the semiconductor substrate, and a source in the semiconductor substrate. The source includes a source region having a first terminating end, a second terminating end, and a length between the first terminating end and the second terminating end. The structure further comprises a shallow trench isolation region in the semiconductor substrate. The shallow trench isolation region surrounds the drain. The structure further comprises a gate that surrounds the shallow trench isolation region and the drain. The gate has a side section between the drain and the source region, the side section of the gate has a width, and the gate has a length in a direction transverse to the width. The length of the source region is substantially equal to the length of the gate.

In an embodiment, a method of forming a structure for a laterally-diffused metal-oxide-semiconductor transistor is provided. The method comprises forming a source, a drain, and a shallow trench isolation region in a semiconductor substrate. The source includes a source region having a first terminating end, a second terminating end, and a length between the first terminating end and the second terminating end. The shallow trench isolation region surrounds the drain. The method further comprises forming a gate that surrounds the shallow trench isolation region and the drain. The gate has a side section between the drain and the source region, the side section of the gate has a width, and the gate has a length in a direction transverse to the width. The length of the source region is substantially equal to the length of the gate.

BRIEF DESCRIPTION OF THE DRAWINGS

The accompanying drawings, which are incorporated in and constitute a part of this specification, illustrate various embodiments of the invention, and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
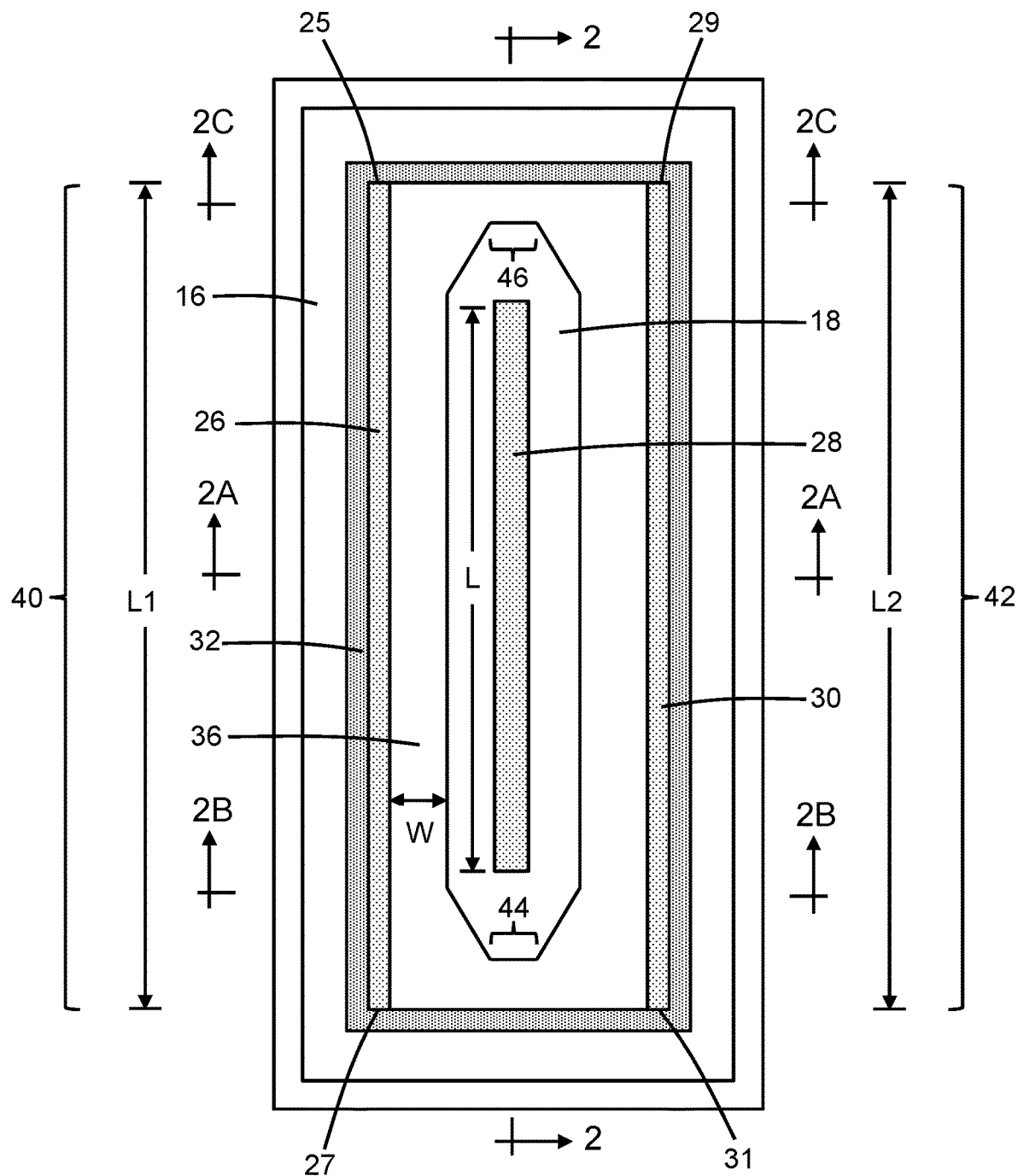
FIG. 1 is a cross-sectional view of a structure in accordance with embodiments of the invention.
Figure 2:
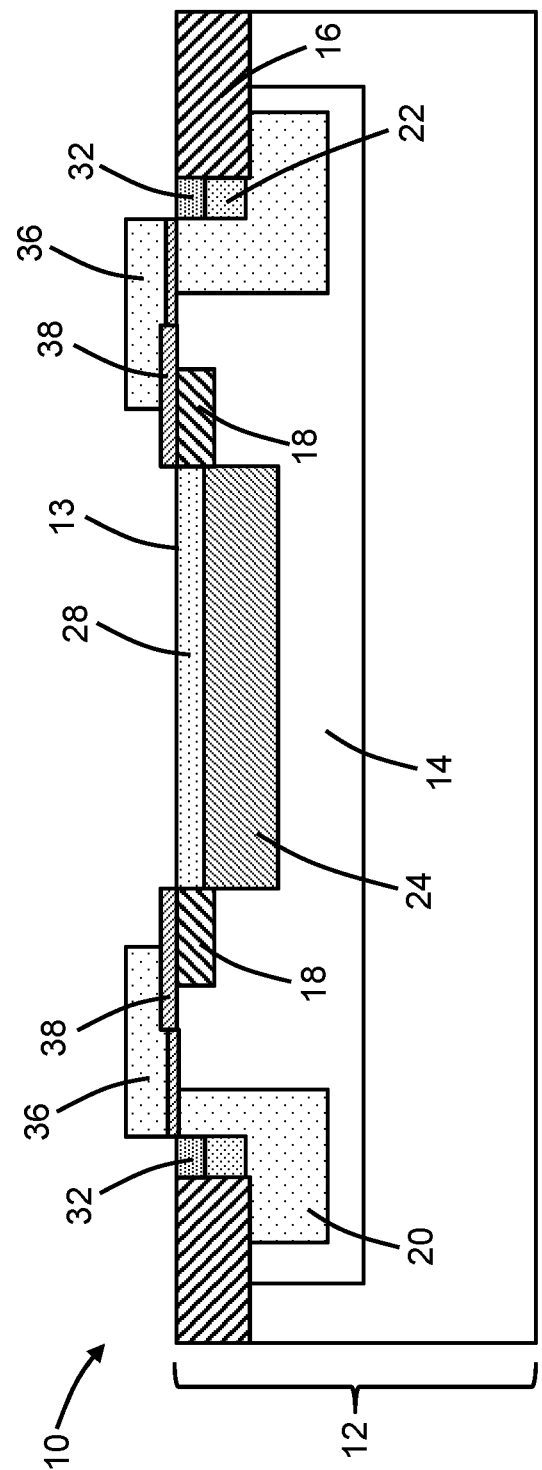
FIG. 2 is a cross-sectional view taken generally along line 2-2 in FIG. 1.
Figure 2A:
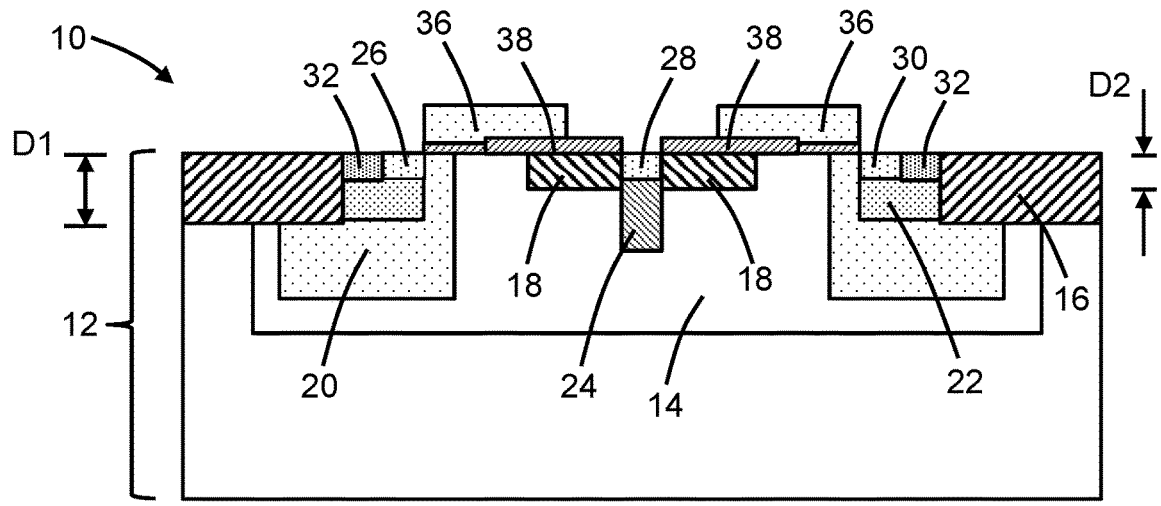
FIG. 2A is a cross-sectional view taken generally along line 2A-2A in FIG. 1.
Figure 2B:
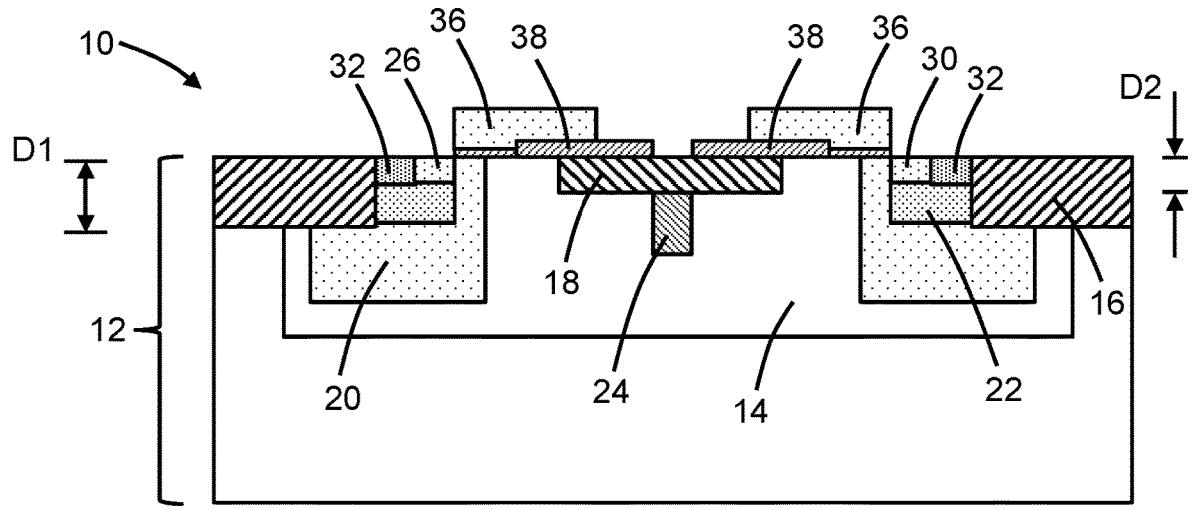
FIG. 2B is a cross-sectional view taken generally along line 2B-2B in FIG. 1.
Figure 2C:
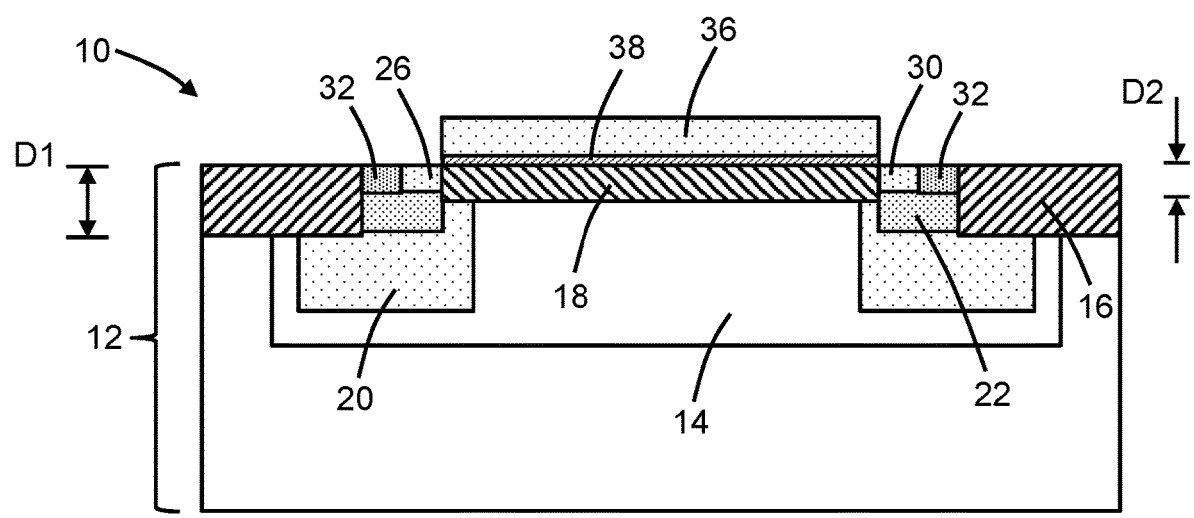
FIG. 2C is a cross-sectional view taken generally along line 2C-2C in FIG. 1.

With reference to FIGS. 1, 2, 2A, 2B, 2C and in accordance with embodiments of the invention, a device structure 10 for a laterally-diffused metal-oxide-semiconductor transistor includes a semiconductor substrate 12, a high-voltage well 14 in the semiconductor substrate 12, a shallow trench isolation region 16 in the semiconductor substrate 12, and a shallow trench isolation region 18 in the semiconductor substrate 12. The semiconductor substrate 12 may be comprised of a semiconductor material, such as single-crystal silicon. In an embodiment, the high-voltage well 14 may be lightly doped with a concentration of an n-type dopant (e.g., arsenic or phosphorus) such that the high-voltage well 14 has n-type conductivity. The high-voltage well 14 may be formed by implanting ions, such as ions including the n-type dopant, with an implantation mask having an opening defining the intended location for the high-voltage well 14 in the semiconductor substrate 12. The implantation conditions, such as ion species, dose, and kinetic energy, may be selected to tune the electrical and physical characteristics of the high-voltage well 14. The high-voltage well 14 may form a p-n junction with the semiconductor substrate 12 across which the conductivity type changes.

The shallow trench isolation region 16 may be formed by patterning shallow trenches in the semiconductor substrate 12 with lithography and etching processes, depositing a dielectric material, such as silicon dioxide, in the shallow trenches, and recessing and/or planarizing the deposited dielectric material. The shallow trench isolation region 16 may extend from a top surface 13 of the semiconductor substrate 12 to a depth D1. The shallow trench isolation region 16 fully surrounds a device region in which the laterally-diffused metal-oxide-semiconductor transistor is situated.

The shallow trench isolation region 18 may be formed by patterning shallow trenches in the semiconductor substrate 12 with lithography and etching processes, depositing a dielectric material, such as silicon dioxide, in the shallow trenches, and recessing and/or planarizing the deposited dielectric material. The shallow trench isolation region 18 is disposed inside the device region and is fully surrounded by the shallow trench isolation region 16. The shallow trench isolation region 18 may extend from the top surface 13 of the semiconductor substrate 12 to a depth D2 that is less than the depth D1 of the shallow trench isolation region 16. The shallow trench isolation region 18 has a closed shape that may be tapered at opposite ends. The shallow trench isolation region 18 includes an inner boundary that fully surrounds a portion of the semiconductor substrate 12, which portion may be centralized within the active region.

A well 20 may be formed in a portion of the semiconductor substrate 12. The well 20 may be disposed within the high-voltage well 14 and the well 20 may form a p-n junction with the high-voltage well 14 across which the conductivity type changes. The well 20 fully surrounds the device region. An outer portion of the well 20 adjacent to an outer edge of the device region may overlap with the shallow trench isolation region 16. In an embodiment, the well 20 may contain a concentration of a p-type dopant (e.g., boron) to provide p-type conductivity. The well 20 may be formed by implanting ions, such as ions including the n-type dopant, with an implantation mask having an opening defining the intended location for the well 20 in the semiconductor substrate 12. The implantation conditions, such as ion species, dose, and kinetic energy, may be selected to tune the electrical and physical characteristics of the well 20. The well 20 may provide a drain extension of the laterally-diffused metal-oxide-semiconductor transistor.

A body well 22 may be formed in a portion of the semiconductor substrate 12. The body well 22 may be disposed within the well 20. The body well 22 may adjoin the shallow trench isolation region 16, and the body well 22 may extend to a depth that is less than the depth of the shallow trench isolation region 16. The body well 22 may provide a body of the laterally-diffused metal-oxide-semiconductor transistor. In an embodiment, the body well 22 may contain a concentration of a p-type dopant (e.g., boron) to provide p-type conductivity at a higher dopant concentration than the well 20. The body well 22 may be formed by implanting ions, such as ions including the p-type dopant, with an implantation mask having an opening defining the intended location for the body well 22 in the semiconductor substrate 12. The implantation conditions, such as ion species, dose, and kinetic energy, may be selected to tune the electrical and physical characteristics of the body well 22.

A drain well 24 may be formed in a portion of the semiconductor substrate 12 and disposed within the high-voltage well 14. The drain well 24 may extend to a depth that is greater than the depth D2 of the shallow trench isolation region 18. In an embodiment, the drain well 24 may adjoin the shallow trench isolation region 18. In an alternative embodiment, the drain well 24 may overlap with the shallow trench isolation region 18. The drain well 24 has the same conductivity type as the high-voltage well 14. In an embodiment, the drain well 24 may contain a concentration of an n-type dopant (e.g., arsenic or phosphorus) to provide n-type conductivity at a higher dopant concentration than the high-voltage well 14. The drain well 24 may be formed by implanting ions, such as ions including the n-type dopant, with an implantation mask having an opening defining the intended location for the drain well 24 in the semiconductor substrate 12. The implantation conditions, such as ion species, dose, and kinetic energy, may be selected to tune the electrical and physical characteristics of the drain well 24.

Doped regions 26, 28, 30 and a doped region 32 are formed in respective portions of the semiconductor substrate 12. The doped regions 26, 28, 30 and the doped region 32 are positioned adjacent to the top surface 13 of the semiconductor substrate 12. The doped region 28, which is disposed in an upper portion of the drain well 24 between the drain well 24 and the top surface 13, is fully surrounded on all sides by the inner edges of the shallow trench isolation region 18. The doped region 28 has the same conductivity type as the drain well 24 but at a higher dopant concentration. The doped region 26 and the doped region 30 are disposed in respective upper portions of the body well 22. The doped region 26 and the doped region 30 have an opposite conductivity type from the body well 22.

The doped region 32 is disposed in an upper portion of the body well 22. The doped region 32 laterally surrounds the portion of the semiconductor substrate 12 in which the doped regions 26, 28, 30, the drain well 24, and the shallow trench isolation region 18 are disposed. A section of the doped region 32 may laterally adjoin the doped region 26, and another section of the doped region 32 may laterally adjoin the doped region 30. The doped region 32 has the same conductivity type as the body well 22. The doped region 32 has an opposite conductivity type from the doped regions 26, 28, 30.

In an embodiment, the doped regions 26, 28, 30 may contain a concentration of an n-type dopant (e.g., arsenic or phosphorus) to provide n-type conductivity. The doped regions 26, 28, 30 may be formed by implanting ions, such as ions including the n-type dopant, with an implantation mask having openings defining the intended locations for the doped regions 26, 28, 30 in the semiconductor substrate 12. The formation of the doped region 28 may be self-aligned to the drain well 24 by the shallow trench isolation region 18. The implantation conditions, such as ion species, dose, and kinetic energy, may be selected to tune the electrical and physical characteristics of the doped regions 26, 28, 30, which may be heavily doped.

In an embodiment, the doped region 32 may contain a concentration of a p-type dopant (e.g., boron) to provide p-type conductivity. The doped region 32 may be formed by implanting ions, such as ions including the n-type dopant, with an implantation mask having an opening defining the intended location for the doped region 32 in the semiconductor substrate 12. The implantation conditions, such as ion species, dose, and kinetic energy, may be selected to tune the electrical and physical characteristics of the doped region 32, which may be heavily doped.

The laterally-diffused metal-oxide-semiconductor transistor may include a source constituted by the source region provided by the doped region 26 and the source region provided by the doped region 30. The doped region 26 may have a rectilinear outer boundary in cross-sectional profile that surrounds an area at the top surface 13 of the semiconductor substrate 12. The doped region 30 also may have a rectilinear outer boundary in cross-sectional profile that surrounds an area at the top surface 13 of the semiconductor substrate 12. In an embodiment, the surrounded area associated with the doped region 26 may be equal in size to the surrounded area associated with the doped region 30.

The doped region 26 has a terminating end 25 and a terminating end 27 opposite to the terminating end 25, and the opposite ends 25, 27 terminate at, and share respective borders with, portions of the doped region 32. The doped region 26 has a length L1 that may be measured between the terminating end 25 and the terminating end 27. The doped region 30 has a terminating end 29 and a terminating end 31 opposite to the terminating end 29, and the opposite ends 29, 31 terminate at, and share respective borders with, portions of the doped region 32. The doped region 30 has a length L2 that may be measured between the terminating end 29 and the terminating end 31. The length L1 of the doped region 26 may be substantially equal to the length L2 of the doped region 30. In an embodiment, the length L1 of the doped region 26 may be equal to the length L2 of the doped region 30.

The doped region 28 may supply a drain of the laterally-diffused metal-oxide-semiconductor transistor. The doped region 28 may have a rectilinear outer boundary in cross-sectional profile that surrounds an area at the top surface 13 of the semiconductor substrate 12 and that is surrounded by the shallow trench isolation region 18. The doped region 28 may have a length L that is less than either the length L1 of the doped region 26 or the length L2 of the doped region 30 such that the drain is shorter than either of the source regions.

A gate 36 is formed on, and over, a portion of the top surface 13 of the semiconductor substrate 12. A gate dielectric layer 38, which is characterized by multiple thicknesses, is disposed between the gate 36 and the top surface 13 of the semiconductor substrate 12. In an embodiment, the gate 36 may be comprised of a conductor, such as doped polysilicon, and the gate dielectric layer 38 may be comprised of a dielectric material, such as silicon dioxide. The thicker portion of the gate dielectric layer 38, which may be formed by high temperature oxidation, is disposed adjacent to the doped region 28 providing the drain of the laterally-diffused metal-oxide-semiconductor transistor. The gate 36 and the gate dielectric layer 38 may overlap with a portion of the shallow trench isolation region 18 adjacent to the doped region 28.

The gate 36 includes side sections 40, 42 that are disposed on opposite sides of the doped region 28 and end sections 44, 46 that connect the side section 40 to the side section 42. The side sections 40, 42 and the end sections 44, 46 of the gate 36 collectively provide a closed shape that surrounds the shallow trench isolation region 18, the doped regions 26, 30 providing the source of the laterally-diffused metal-oxide-semiconductor transistor, and the doped region 28 providing the drain of the laterally-diffused metal-oxide-semiconductor transistor.

The side section 40 of the gate 36 and the ends 25, 27 of the doped region 30 may be coextensive or substantially coextensive with (i.e., share a boundary with) portions of the doped region 32. In an embodiment, the side section 40 of the gate 36 may have a length that is substantially equal to the length L1 of the doped region 26. In an alternative embodiment, the side section 40 of the gate 36 may have a length that is equal to the length L1 of the doped region 26. The length of the side section 40 of the gate 36 may be greater than the length L of the doped region 28.

The side section 42 of the gate 36 and the ends 29, 31 of the doped region 26 are coextensive or substantially coextensive with (i.e., share a boundary with) portions of the doped region 32. In an embodiment, the side section 42 of the gate 36 may have a length that is substantially equal to the length L2 of the doped region 30. In an alternative embodiment, the side section 42 of the gate 36 may have a length that is equal to the length L2 of the doped region 30. The length of the side section 42 of the gate 36 may be greater than the length L of the doped region 28.

Each of the side sections 40, 42 has a width W in a direction transverse to their respective lengths, and the length of each of the side sections 40, 42 may be greater than the width W such that the gate 36 is elongated. The width W may be constant over the length L of the doped region 28, may widen adjacent to the tapered section of the shallow trench isolation region 18, and may be wider where connected by the narrow end sections 44, 46.

The doped region 32, which is disposed within the body well 22, provides a body tap that is accessible at the top surface 13 of the semiconductor substrate 12. The body well 22 and the doped region 32 in the body well 22 fully surround the device region in a lateral direction. In that regard, the body well 22 and the doped region 32 in the body well 22 fully surround a portion of the semiconductor substrate 12 that includes the shallow trench isolation region 18 and the doped regions 26, 28, 30, and also fully surround the gate 36. The doped region 32 has a section that adjoins the doped region 26 along the length of the gate 36, the doped region 32 has a section that adjoins the doped region 30 along the length of the gate 36, and the shallow trench isolation region 18, the doped region 28, and the gate 36 are laterally disposed between these sections of the doped region 32.

The laterally-diffused metal-oxide-semiconductor transistor has an isolated body provided by the body well 22. The termination of the shallow trench isolation region 18 and the termination of the gate 36 may function to improve device breakdown. The source of the laterally-diffused metal-oxide-semiconductor transistor, which is represented by a source region provided by the doped region 26 adjacent to the side section 40 of the gate 36 in combination with a source region provided by the doped region 30 adjacent to the side section 42 of the gate 36, does not fully surround the gate 36 of the laterally-diffused metal-oxide-semiconductor transistor. Instead, the doped region 26 is disconnected from the doped region 30 such that the source lacks regions adjacent to the end sections 44, 46 of the gate 36 and, therefore, absent adjacent to the opposite ends of the doped region 28. Consequently, current crowding at the end edges of the drain is reduced by the segmentation of the source into disconnected source regions. In contrast to the source, the body well 22 providing the body of the laterally-diffused metal-oxide-semiconductor transistor fully surrounds the gate 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor transistor, the structure comprising:
    a semiconductor substrate;
    a drain in the semiconductor substrate;
    a source in the semiconductor substrate, the source including a first source region having a first terminating end, a second terminating end, and a length between the first terminating end and the second terminating end;
    a first shallow trench isolation region in the semiconductor substrate, the first shallow trench isolation region surrounding the drain; and
    a gate that surrounds the first shallow trench isolation region and the drain, the gate having a first side section between the drain and the first source region, the first side section of the gate having a width, and the gate having a length in a direction transverse to the width,
    wherein the length of the first source region is substantially equal to the length of the gate.

2. The structure of claim 1 wherein the source includes a second source region in the semiconductor substrate, and the second source region has a first terminating end, a second terminating end, and a length between the first terminating end and the second terminating end.

3. The structure of claim 2 wherein the gate is laterally disposed between the first source region and the second source region.

4. The structure of claim 2 wherein the length of the second source region is substantially equal to the length of the gate.

5. The structure of claim 2 wherein the length of the second source region is substantially equal to the length of the first source region.

6. The structure of claim 2 wherein the drain is laterally disposed between the first source region and the second source region.

7. The structure of claim 2 wherein the gate has a second side section between the drain and the second source region, and the second side section of the gate has the width.

8. The structure of claim 2 wherein the drain is laterally disposed between the first source region and the second source region.

9. The structure of claim 8 wherein the drain has a length, the length of the drain is less than the length of the first source region, and the length of the drain is less than the length of the second source region.

10. The structure of claim 1 wherein the length of the gate is greater than the width of the first side section of the gate.

11. The structure of claim 1 wherein the first source region has a first rectilinear outer boundary, the drain has a second rectilinear outer boundary, and the drain has a length that is less than the length of the first source region.

12. The structure of claim 1 further comprising:
    a second shallow trench isolation region in the semiconductor substrate, the second shallow trench isolation region surrounding the first shallow trench isolation region, the gate, and the drain, and the second shallow trench isolation region extending to a greater depth than the first shallow trench isolation region.

13. The structure of claim 12 further comprising:
    a well in the semiconductor substrate, the well surrounding the drain, the gate, and the first shallow trench isolation region,
    wherein the well overlaps with the second shallow trench isolation region.

14. The structure of claim 1 further comprising:
    a body well in the semiconductor substrate, the body well surrounding the drain, the gate, and the first shallow trench isolation region,
    wherein the first source region is disposed within the body well.

15. The structure of claim 14 further comprising:
    a doped region in the body well, the doped region surrounding the drain, the gate, and the first shallow trench isolation region,
    wherein the doped region and the body well has the same conductivity type, and the doped region has a higher dopant concentration than the body well.

16. The structure of claim 15 wherein the first source region is disposed in the body well adjacent to the doped region, and the first source region has an opposite conductivity type from the doped region.

17. The structure of claim 1 wherein the gate overlaps with a portion of the first shallow trench isolation region.

18. The structure of claim 1 wherein the gate has a first end section and a second end section, and the drain is longitudinally disposed between the first end section and the second end section.

19. The structure of claim 1 further comprising:
    a gate dielectric layer beneath the gate, the gate dielectric layer having a thicker section adjacent to the drain, and the thicker section overlapping with the first shallow trench isolation region.

20. A method of forming a structure for a laterally-diffused metal-oxide-semiconductor transistor, the method comprising:
    forming a source and a drain in a semiconductor substrate, wherein the source includes a source region having a first terminating end, a second terminating end, and a length between the first terminating end and the second terminating end;
    forming a shallow trench isolation region in the semiconductor substrate, wherein the shallow trench isolation region surrounds the drain; and
    forming a gate that surrounds the shallow trench isolation region and the drain, wherein the gate has a side section between the drain and the source region, the side section of the gate has a width, and the gate has a length in a direction transverse to the width,
    wherein the length of the source region is substantially equal to the length of the gate.

* * * * *